United States Patent [19]

Iggulden et al.

[11] Patent Number: 5,258,867
[45] Date of Patent: Nov. 2, 1993

[54] BASE STATION PERFORMANCE ENHANCEMENTS FOR INFRARED-LINKED TELEPHONE AND COMMUNICATIONS SYSTEMS

[75] Inventors: Jerry R. Iggulden, Santa Clarita, Calif.; Ron Poulin, British Columbia, Canada; Donald A. Streck, Kailua, Hi.

[73] Assignee: Light Ideas Incorporated, Encino, Calif.

[21] Appl. No.: 774,789

[22] Filed: Oct. 10, 1991

[51] Int. Cl.$^5$ .................... H04B 10/00; G02B 5/10
[52] U.S. Cl. .................... 359/159; 359/168; 359/867; 250/206.2
[58] Field of Search .......... 359/143, 152, 159, 164, 359/172, 168, 355, 356, 867, 868, 869; 250/206.2, 216; 362/88, 296, 298; 379/56

[56] References Cited

U.S. PATENT DOCUMENTS

| | | | |
|---|---|---|---|
| 4,114,592 | 9/1978 | Winston | 359/867 |
| 4,990,788 | 2/1991 | Rayl et al. | 359/867 |
| 5,023,440 | 6/1991 | Kuppenheimer, Jr. | 250/216 |

FOREIGN PATENT DOCUMENTS 0400176 12/1990 European Pat. Off. ............ 359/159

0053529 3/1987 Japan .................... 359/159

Primary Examiner—Richard E. Chilcot, Jr.
Assistant Examiner—Kinfe-Michael Negash
Attorney, Agent, or Firm—Donald A. Streck

[57] ABSTRACT

Enhancements to the base station of an infrared-linked communication system include tubular reflective concentrator apparatus for reflecting IR signals entering an inlet end onto a photodetector located at an outlet end. Signal-to-noise ratio is improved, signal gain in attained, and unwanted light signals are excluded thereby. The tubular reflective concentrator apparatus can also be employed with IR emitters to focus and direct emitted light from an LED or the like towards a predefined field of view. Multiple tubular reflective concentrator apparatus is shown implemented in a unitary, molded plastic shell. The photodetectors and emitters can also be mounted at the bottom of an associated tubular reflective concentrator apparatus with a plug attached thereto so that they can be plugged into a support structure to provide custom installations where necessary. The tubular reflective concentrator apparatus can be shaped to cover different fields of view with a rectangular shape being the preferred shape for reducing redundant overlapping which is required with circular fields of view and the like.

22 Claims, 6 Drawing Sheets

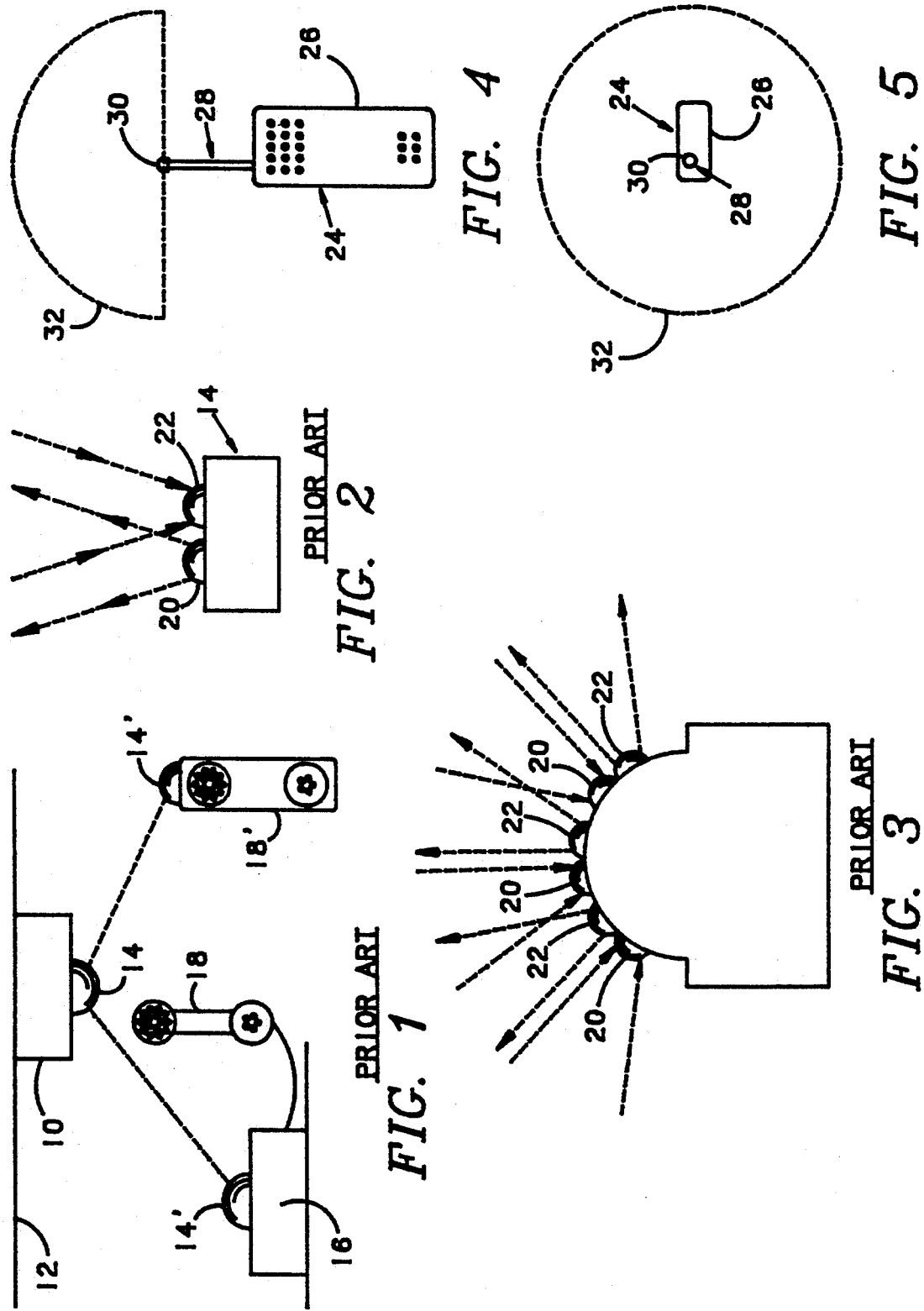

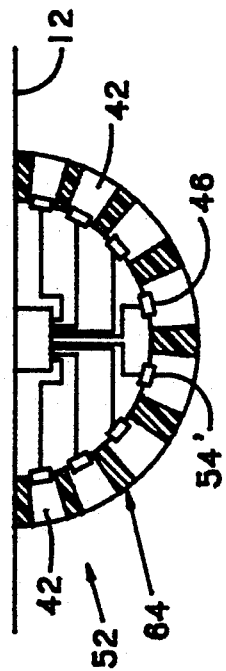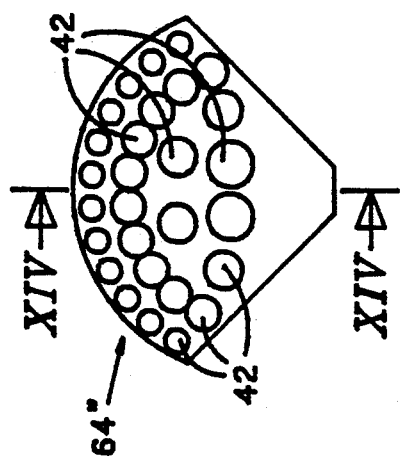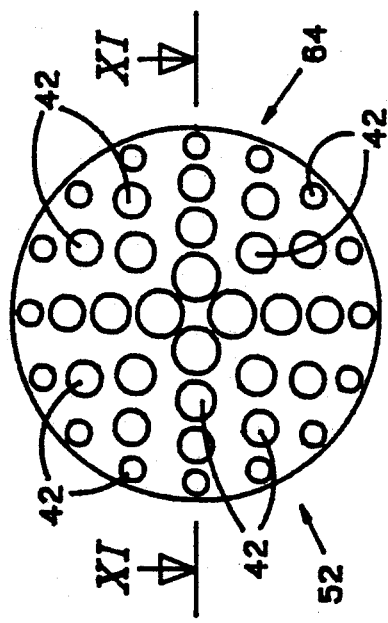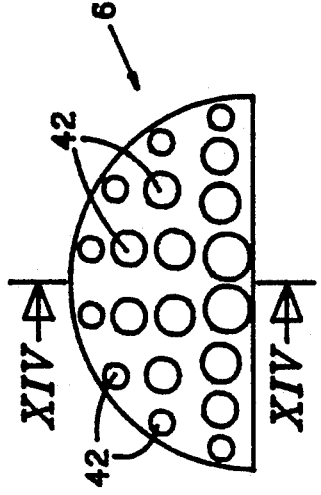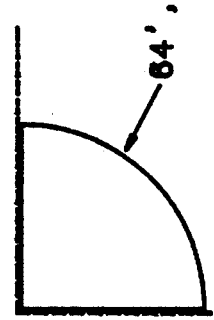

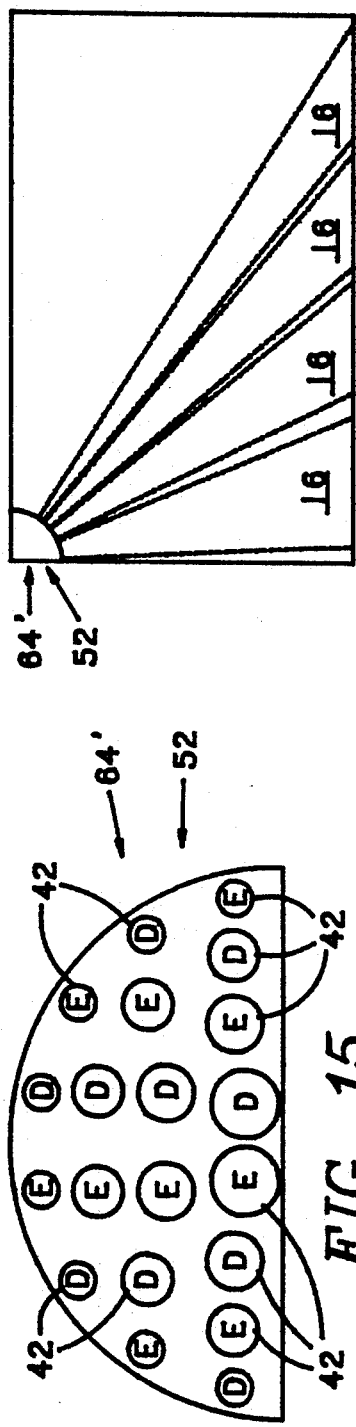
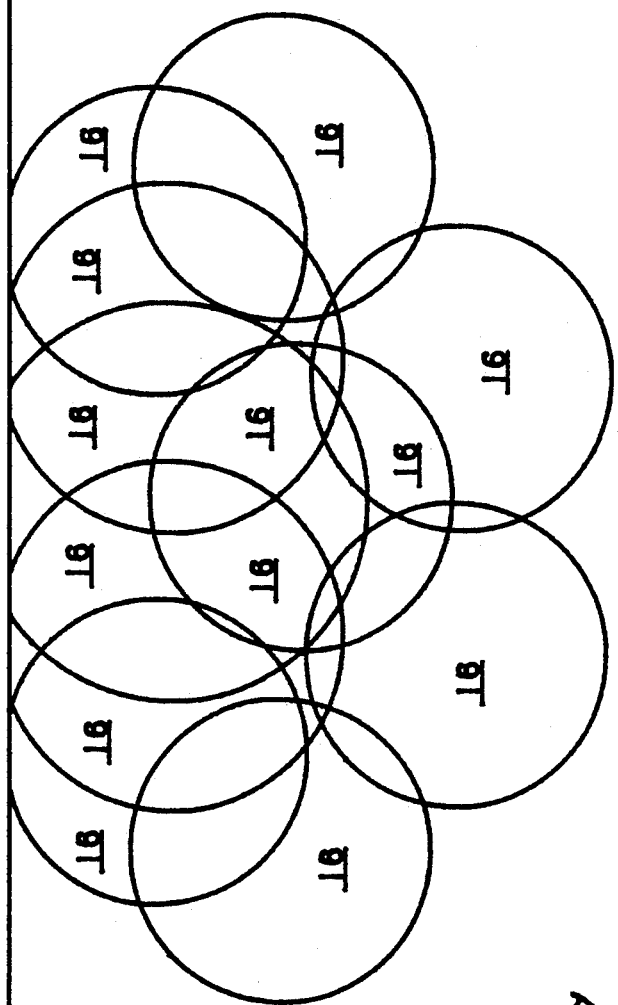

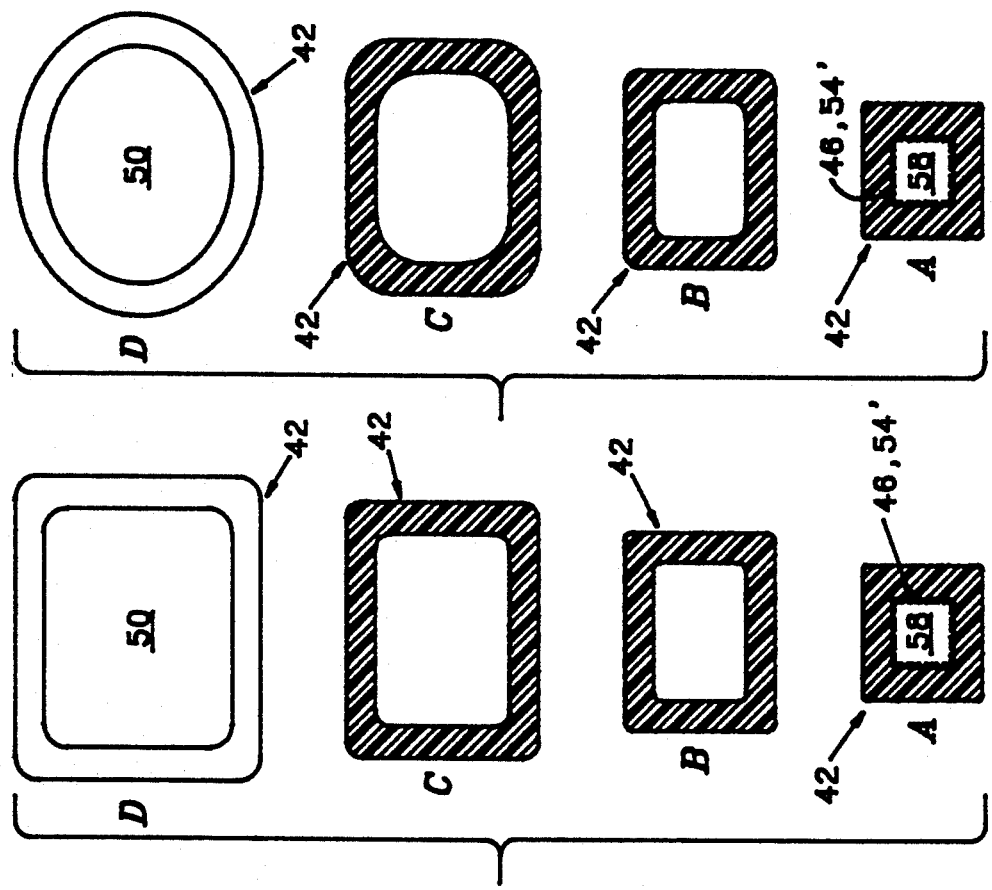
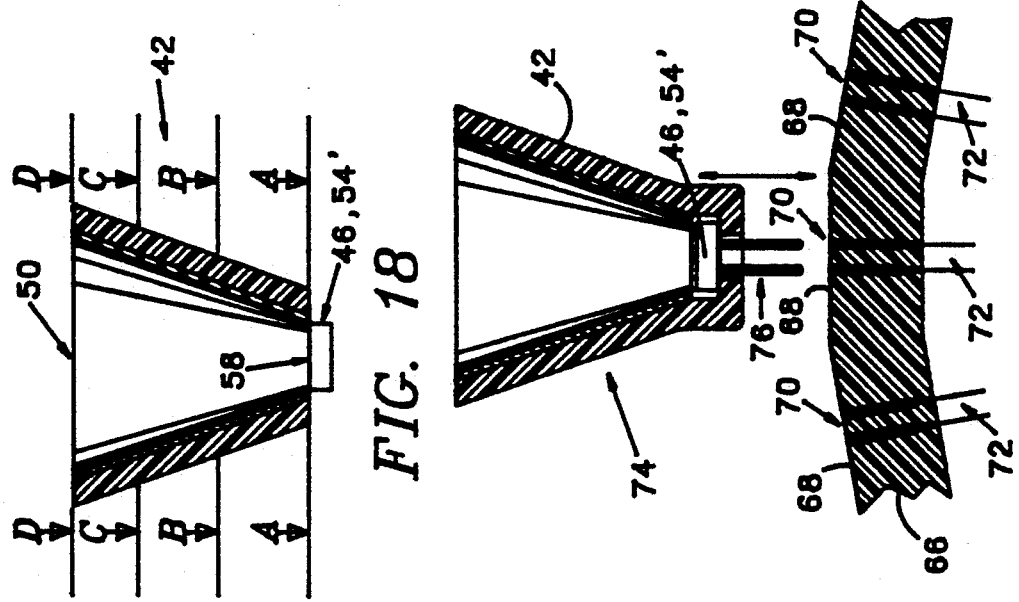

BASE STATION PERFORMANCE ENHANCEMENTS FOR INFRARED-LINKED TELEPHONE AND COMMUNICATIONS SYSTEMS

BACKGROUND OF THE INVENTION

This invention relates to telephone systems and the like communicating between a handset and a base station with infrared light energy and, more particularly, in a communications system wherein a photodetector receives light signals on an active sensing surface thereof and outputs an electrical signal proportional to the amount of light impinging on the active sensing surface, reflective concentrator apparatus for aiming the photodetector at a field of view and for improving the signal-to-noise ratio and providing signal gain comprising, a tubular reflective concentrator having an inlet end, an outlet end which is smaller than the inlet end, a focal plane located adjacent the outlet end, and a reflective inner surface disposed between the inlet end and the focal plane and reflecting substantially all light beams entering the inlet end onto the focal plane, the tubular IR reflective concentrator having the photodetector disposed adjacent the focal plane with the active sensing surface thereof disposed in the focal plane whereby light beams entering the inlet end are reflected onto the active sensing surface of the photodetector.

Communications systems containing a bi-directional or uni-directional link by means of infrared (IR) light energy are known in the art. There are also several examples of telephone systems of one kind or another employing IR linking. Examples of the foregoing can be seen with reference to the following U.S. Pat. Nos. Nash (1980): 4,241,236; Lucey (1984): 4,450,319; Baker et al. (1984): 4,456,793; Crimmins (1985): 4,553,267; Avakian (1988): 4,727,600; Parienti (1988): 4,776,000; Matheny (1989): 4,829,561; and Streck et al (1989): 4,856,046.

A typical prior art telephone system employing an IR link is shown in FIG. 1 (as exemplified by a portion of FIG. 3 in the Baker et al. patent referred to above). The base station 10 is located on the ceiling 12 and includes a bi-directional IR link 14. The user devices can comprise a desktop device 16 having its own bi-directional IR link 14' and attached handset 18 or a portable handset 18' having the bi-directional IR link 14' built in. A computer terminal with modem can also communicate with the base station 10 using the desktop device 16. The prior art teachings relative to the actual IR link in an IR telephone system, or the like, are either non-definitive boxes labelled "IR", or "IR LINK"; or, are as depicted in FIGS. 2 and 3. For example, the bi-directional IR link 14 of FIG. 2 has a light emitting diode 20 with a conical emission pattern of less than 90° placed adjacent to a photodiode 22 having a similar conical field of view and response to incoming IR signals. FIG. 3 depicts an IR control signal transmitting device comprised of a plurality of light emitting diodes 20 with conical emission patterns of about 30° placed along a semi-circular support to radiate in a semi-annular arc. A similar approach is employed in the above-referenced Avakian patent wherein a plurality of pairs of light emitting diodes 20 and photodiodes 22 are mounted on a pair of partial spherical surfaces on opposite ends of a fixed IR signal repeater system.

The foregoing prior art approached to a bi-directional IR link are probably suitable for the purpose in a fixed handset system where the IR link associated with the handset can be pointed in an optimal manner towards the IR link of the base station and remain there during use. In a truly portable IR-linked handset, however, the prior art approaches to the IR link (or their ignoring of the subject altogether) are totally unacceptable for a commercially-successful and user-acceptable system. In this regard, users of a portable, wireless telephone expect it to have certain operating characteristics regardless of whether it is an radio frequency (RF) link or an IR link. Being a line-of-sight device, an IR-linked handset must be more carefully thought out and potential problems inherent to a light system as compared to an RF system-must be addressed with particularity in order to have a product which is acceptable to the vast majority of the consumers and users. An IR-linked portable handset in a basic embodiment thereof according to a co-pending application of the assignee of this application filed on even data herewith entitled OPTICAL ANTENNA SYSTEMS FOR INFRARED-LINKED TELEPHONE AND COMMUNICATIONS DEVICES, Ser. No. 07/774,794 by Jerry R. Iggulden et al. is shown in simplified form in FIGS. 4 and 5 where it is generally indicated as 24. The handset 24 comprises a telephone body 26 which can be generally according to prior art IR telephone techniques for purposes of this application since the points of novelty do not reside in those portions of the handset 24. An optical antenna 28 extends upward from the body 26 and has a transmitting/receiving tip 30 on the upper end thereof. The transmitting/receiving tip 30 has a generally hemispherical field of view 32 as indicated by the dashed lines so labelled. FIG. 4 and 5 are not drawn to scale as in a typical handset 24 according to this invention, the radius of the hemisphere would ideally be about one hundred feet.

Other aspects and considerations of an infrared (IR) linked communications system having base station and a portable handset are the battery life of the handset as well as the size and weight of the handset. Cost of manufacture and retail sale to the consumer is also a major factor. In an IR-based wireless public-access telephone system, the cost of the handsets to the consuming and using public should be very low while the cost of the base stations or "telepoints" connected to the telephone lines can be higher. Thus, where performance criteria can be solved in the base station rather than in the handset, it is preferable to do so.

Wherefore, it is an object of the present invention to provide a wireless public access telephone system in which portable, wireless telephone handsets employing IR links to base stations behave like an RF-linked system within line-of-sight and range of the base stations.

It is another object of the present invention to provide a wireless public access telephone system where portable, wireless telephone handsets employing IR links to base stations in which performance criteria are met primarily in the base stations so that the handsets can be low-power, low-cost devices.

It is still another object of the present invention to provide performance enhancements for the base station of wireless public access telephone system where portable, wireless telephone handsets employing IR links to base stations.

Other objects and benefits of the invention will become apparent from the detailed description which follows hereinafter when taken in conjunction with the drawing figures which accompany it.

SUMMARY

The foregoing objects have been achieved in an infrared (IR) linked communications system having base stations and handsets each having an emitter emitting IR communications signals and a photodetector detecting IR communications signals and producing electrical signals therefrom, by the improvement of the present invention for reducing the cost to manufacture and power requirements of the handsets comprising, each base station employing an emitter emitting strong IR communications signals into a field of view of the base station whereby the strong IR communications signals are easily detected by a low-cost photodetector in the handsets; and, each base station including a tubular IR reflective concentrator having an inlet end, an outlet end which is smaller than the inlet end, a focal plane located adjacent the outlet end, and a reflective inner surface disposed between the inlet end and the focal plane and reflecting substantially all IR light beams entering the inlet end from the field of view of the base station onto the focal plane, the tubular IR reflective concentrator having the photodetector disposed adjacent the focal plane with an active sensing surface of the photodetector disposed in the focal plane so that IR communications signals entering the inlet end are reflected onto the active sensing surface of the IR photodetector whereby there is a gain in strength of the IR communications signals, there is an improvement in the signal-to-noise ratio, and the handsets can employ low-power emitters.

The preferred embodiment additionally comprises, a plurality of emitters aimed to direct IR communications signals into different portions of the field of view of the base station; a plurality of photodetectors; and, a plurality of the tubular IR reflective concentrators associated with respective ones of the plurality of photodetectors and aimed to receive IR communications signals from different portions of the field of view of the base station.

In one configuration, each of the plurality of tubular IR reflective concentrators has a circular cross section at all points between the outlet end and the inlet end.

In another configuration the active sensing surface of the photodetectors is rectangular in shape and each of the plurality of tubular IR reflective concentrators has a generally rectangular cross section at the focal plane. Preferably, the active sensing surface of the photodetector and the cross section of each of the plurality of tubular IR reflective concentrators at the focal plane are substantially the same size and shape.

In still another configuration, each of the plurality of tubular IR reflective concentrators has a generally rectangular cross section at all points between the focal plane and the inlet end.

In yet another configuration, each of the plurality of tubular IR reflective concentrators has a non-rectangular cross section at the inlet end and smoothly changes its cross sectional shape between the focal point and the inlet end.

In an assembly construction, each of the plurality of tubular IR reflective concentrators has the photodetector mounted therein adjacent the outlet end with the active sensing surface in the focal plane.

For a reconfigurable base station employing the assembly construction, plug means are electrically connected to the IR photodetector for removably plugging the tubular IR reflective concentrator and the IR photodetector in combination into a socket provided therefor at a base station of the communications system.

In a preferred implementation, a plurality of second tubular IR reflective concentrators are also associated with respective ones of the plurality of emitters and have an outlet end, an inlet end which is smaller than the outlet end, a focal plane located adjacent the inlet end, and a reflective inner surface disposed between the outlet end and the focal plane and reflecting substantially all IR light beams originating at the focal plane towards and into the outlet end, each of the plurality of tubular IR reflective concentrators also having its associated emitter disposed adjacent the focal plane with an active emitting surface of the emitter disposed in the focal plane whereby IR light beams from the emitter are focused towards and onto a field of view having a size and shape related to the size and shape of the outlet end.

Light shield means may also be carried by at least one of the plurality of tubular IR reflective concentrators adjacent the inlet end for blocking light beams from outside a desired field of view from entering the inlet end. Preferably, any such light shield means has a dark matte surface facing the inlet end for absorbing light beams from outside the desired field of view.

DESCRIPTION OF THE DRAWINGS

FIG. 1 is a simplified drawing of a prior art telephone system wherein the user elements are linked to a base station by an infrared link.

FIG. 2 is a simplified drawing of a prior art approach to a bi-directional infrared link for use in an infrared-linked telephone or the like.

FIG. 3 is a simplified drawing of a prior art approach to a multi-directional infrared transmitter for use in infrared control apparatus, repeaters, and the like.

FIG. 4 is a simplified drawing of an infrared-linked handset for a public telephone access system according to a copending application of the common assignee hereof depicting how the optical antenna thereof radiates and receives infrared energy in a hemispherical pattern.

FIG. 5 is a simplified drawing of the infrared-linked handset of FIG. 4 further depicting how the optical antenna thereof radiates and receives infrared energy in a hemispherical pattern.

FIG. 6 is a simplified cutaway side view of a prior art light reflective device such as used in flashlights and the like.

FIG. 10 is a simplified plan view of a base station emitting/detecting head according to the present invention for employing IR light reflective devices in association with both the IR emitters and the photodetectors and for covering an extended circular field of view.

FIG. 11 is a simplified cutaway view through the emitting/detecting head of FIG. 11 in the plane XI—XI.

FIG. 12 is a simplified plan view of a base station emitting/detecting head according to the present invention for employing IR light reflective devices in association with both the IR emitters and the photodetectors and for covering an extended semicircular field of view.

FIG. 13 is a simplified plan view of a base station emitting/detecting head according to the present invention for employing IR light reflective devices in association with both the IR emitters and the photodetectors and for covering an extended quarter-circular field of view.

FIG. 14 is a very simplified view of the emitting/detecting heads of FIGS. 12 and 13 in the plane XIV—XIV.

FIG. 15 is a simplified plan view of emitting/detecting head of FIG. 12 showing the paired layout of the emitters and detectors.

FIG. 16 is a very simplified side view of the emitting/detecting head of FIG. 12 showing how the emitters and detectors cover different areas within the field of view of the head.

FIG. 17 is a very simplified plan view of the field of view of the emitting/detecting head of FIG. 12 depicting the overlapping circular areas associated with the various emitters and detectors within the field of view.

FIG. 18 a simplified cutaway side view of an IR light reflective device as employed in the present invention with multiple cut lines designated thereon.

FIG. 19 comprises simplified plan views of an IR light reflective device at the cut lines designated in FIG. 18 wherein the IR light reflective device has a generally rectangular field of coverage.

FIG. 20 comprises simplified plan views of an IR light reflective device at the cut lines designated in FIG. 18 wherein the IR light reflective device has a generally elliptical field of coverage.

FIG. 22 is a cutaway drawing showing how an emitting/detecting head support structure can be provided with sockets at IR reflective concentrator (IRRC) locations into which selected IRRCs having specific attributes can be plugged so as to easily customize an emitting/detecting head for a particular installation.

DESCRIPTION OF THE PREFERRED EMBODIMENT

The present invention is based on the approach to the overall system of meeting performance criteria primarily in the base stations so that the handsets can be low-power, low-cost devices. For example, if power requirements at the handset can be reduced and range requirements relative to bi-directional transmissions can be achieved through enhancements to the base station and the components employed therein, the design criteria will be met in an optimum manner. Lower power at the handset means a smaller lower-cost battery, longer battery life between rechargings, and lower-cost components for overall smaller size and lower cost to manufacture. This, of course, means that the handsets will be transmitting at low power so that the base stations will have to be very sensitive to low power IR signals and be able to increase the signal-to-noise ratio of the detected signals. As a corollary, the base stations should do as much as possible to completely screen out noise-producing light energy from the detection process. Correspondingly, the handsets will have less sensitive IR detecting capability so that the base stations should emit as much IR signal strength as possible. The present invention is directed to achieving both these objectives. In this regard, it should be apparent to those skilled in the art that very approach of maximizing signal strength and signal detection capability in the base station and minimizing signal strength and signal detection capability in the handsets of an IR-linked communications system is itself a novel approach to a wireless communications system.

Figure 6:
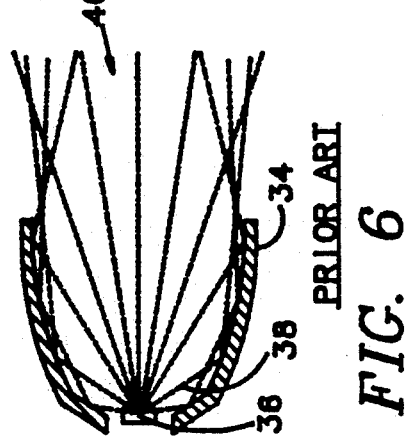

Turning first to FIG. 6, the well-known parabolic-type reflector 34 is depicted therein. Such devices are used in flaslights, headlights, etc. where a generally point source of light 36 (i.e. a filament or bulb with filament) is placed at the focal point of the parabolic reflective surface of the reflector 34. Thus, all the individual light beams 38 emanating from the point source of light 36 are all reflected outward in a concentrated light beam 40. Depending on the exact curve of the reflector 34, the concentrated light beam 40 can be made narrow (i.e. a spotlight) or wide (i.e. a floodlight). Likewise, incoming light will be reflected to the focal point of the parabolic reflective surface of the reflector 34. That approach is used for solar "telescopes" to receive and detect very low power energy waves and the like. The same approach is used to concentrate solar energy in a so-called "solar furnace". A middle ground to solar concentration for energy gathering purposes is addressed with so-called concentric parabolic concentrators (CPCs). Instead of concentrating all the incoming energy at a single focal point to generate high intensity temperatures capable of melting metal as in the solar furnace, the incoming solar energy is directed equally across the surface of an energy collector such as the entire peripheral surface of a pipe having an energy-absorbing liquid running therethrough or the flat surface of a solar cell to directly generate electricity. One of the primary objectives is to allow the solar energy system to receive and optimally apply the sun's rays throughout the day as the sun moves across the sky without the necessity of having to constantly move the system so as to point at the sun. A similar approach has been employed since at least the 1970's to direct in-coming far infrared (FIR) energy from deep space, for example, across the surface of an FIR detector so that the absorbing area is maximized thereby producing a correspondingly maximized signal output. Research relative to the design of CPCs for specific purposes had been enormous and anyone interested in this particular field and desiring more information and greater details can refer to the book High Collection Nonimaging Optics by W. T. Welford and R. Winston (Academic Press, Inc.). Professor Winston has also published and article at page 76 of the March, 1991 edition of Scientific American entitled "Nonimaging Optics". Reference can also be made to the following U.S. Pat. Nos. Winston (4,003,638); Winston (3,957,031); Winston (4,002,499); Winston (4,237,332); Holland (4,266,858); Clegg (4,572,621); Mori (4,541,414); Manelas (4,080,221); Tipton (4,462,392); Dorfeld et al. (4,166,917); and PCT/U.S.90/02427 (Winston et al.).

Figure 7:
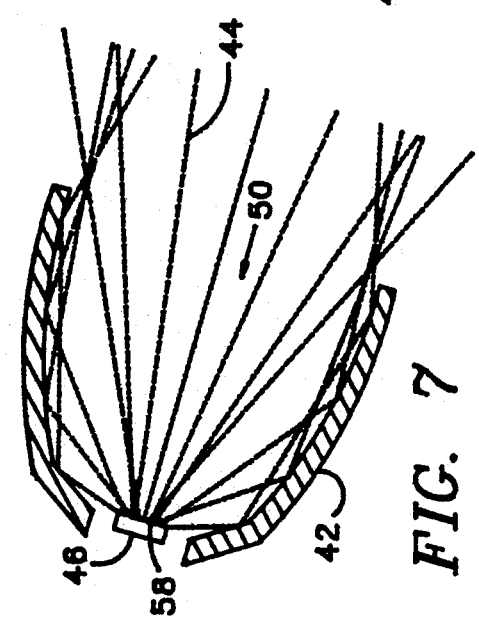
FIG. 7 a simplified cutaway side view of an IR light reflective device as employed in the present invention for both emitting and detecting light.

While it can be seen from the foregoing that a large body of knowledge has been established for maximizing the recovery of energy waves of various kinds employing non-imaging optics, those skilled in the art will readily recognize and appreciate that within the environment addressed by the present invention (i.e. bi-directional communications between a low-power handset and a base station employing infrared (IR) light at a maximum distance of perhaps one hundred feet, such esoteric approaches are not necessary. What is required is a modification of the "flashlight" technology of FIG. 6 to suit the specific requirements of the application. One approach according to this invention is depicted in FIG. 7. As described in the above-referenced co-pending application of Iggulden et al., the communications apparatus as wherein the present invention is applicable preferably employs IR emitting and detecting dies which emit and detect IR beams within a generally hemispherical pattern with respect to the surface of the die wherein the beams have a maximum subtended angle of about 170° rather than a true 180°. As depicted in FIG. 7, the IR reflective concentrator (IRRC) 42 employs a modified parabolic curvature which will direct incoming IR beams 44 across the entire light-absorbing and sensing surface of a photodetecting die 46. The design of such reflecting surfaces is well known to those in the headlight, spotlight, and flashlight arts and, therefore, in the interest of simplicity and the avoidance of redundancy, that aspect of the present invention will not be addressed in any further detail herein. Formulas for calculating reflective surfaces to obtain virtually any results are also contained within the above-referenced published materials by Professor Winston.

Figure 8:
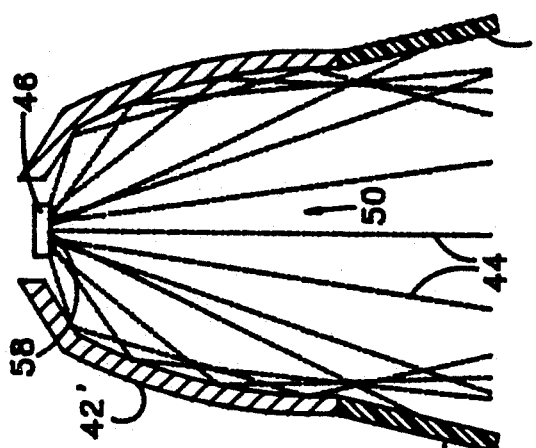
FIG. 8 is a simplified cutaway side view of the IR light reflective device of FIG. 7 with the addition of mechanical shading apparatus.

U.S. Pat. No. 4,867,046 by Streck et al. entitled REMOTE PUBLIC TELEPHONE LINK, which is owned by the common assignee of this application, discloses in part the use of mechanical shielding to direct the field of view of an IR-detecting base station for various purposes. An IRRC 42' for accomplishing certain of those objectives is shown in FIG. 8. In the IRRC 42', shields 48 are disposed around all or part of the inlet opening 50 of the IRRC 42. In this regard, it is anticipated that in commercial embodiments of the present invention in its various embodiments as described herein, the IRRCs will be formed of injection molded plastic with the metallic reflective surfaces applied thereto by vapor deposition techniques well known in the art. The shields 48 in such case could be integrally molded with the IRRC 42' or added thereafter. Preferably, the shields 48 have a matte black inner surface to absorb any undesired (i.e. noise) light so as to prevent its entering the IRRC 42' and being directed onto the photodetecting die 46. If it is desired to make the shields 48 positionable at installation time to suit the needs of individual installations, snap-fit ball and socket type joiners can be molded into the shields 48 and a mating edge of the IRRC 42' adjacent the inlet opening 50.

Figure 9:
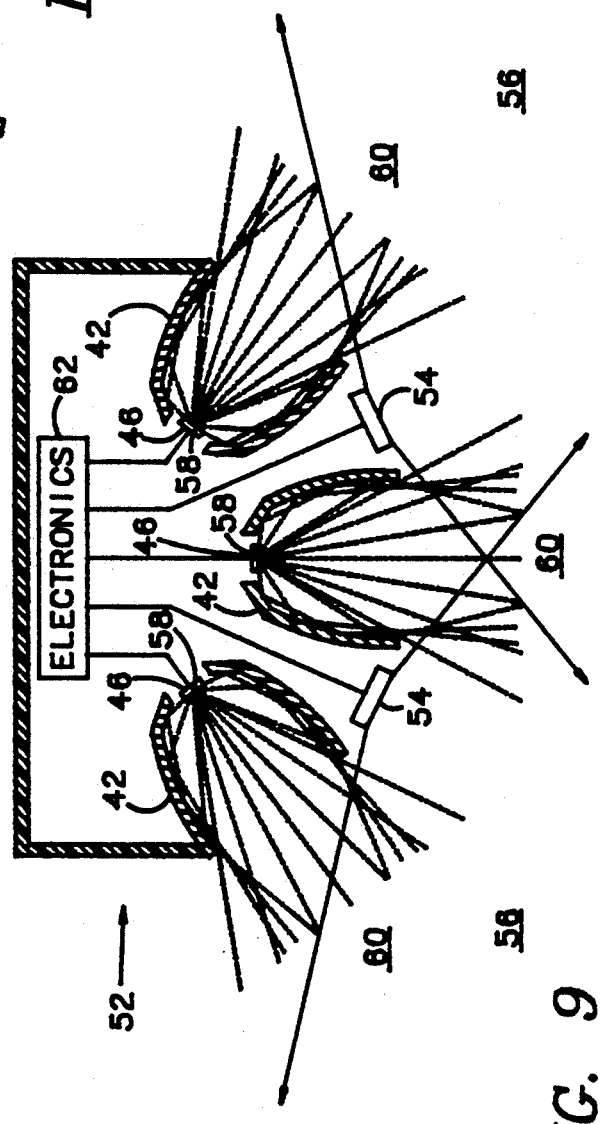
FIG. 9 is a simplified cutaway plan view of a base station emitting/detecting head according to the present invention employing IR light reflective devices in association with the photodetectors only.
Figure 21:
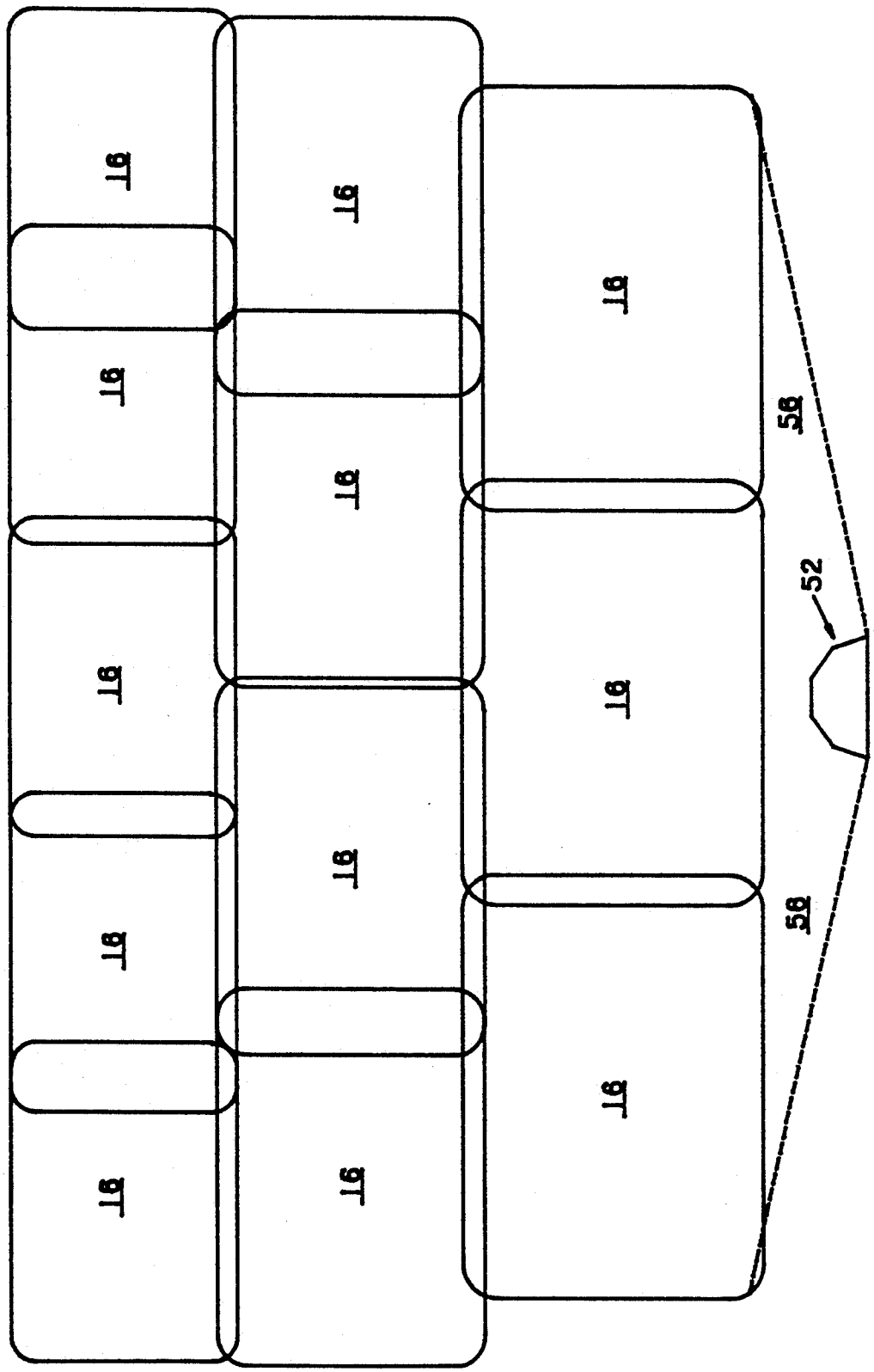
FIG. 21 is a very simplified plan view of the field of view of an emitting/detecting head employing multiple IR light reflective devices having a generally rectangular field of coverage as shown in FIG. 19 depicting the rectangular areas associated with the various emitters and detectors within the field of view.

Turning now to FIG. 9, an emitting/detecting head 52 which can be incorporated into a base station or used in conjunction therewith is shown in simplified form. In this case, the emitting/detecting head 52 includes a plurality of wide-angle LEDs 54 being sufficient in number and power output to flood the field of view 56 of the emitting/detecting head 52 with sufficient IR energy to be detected easily by handsets within the field of view 56. As will be seen shortly, added capability can be achieved by employing IRRCs with the IR emitters as well. A plurality of IRRCs 42 each having the active sensing surface of a photodetecting die 46 located in its focal plane 58 are disposed to have their individual fields of view 60 coincide with the field of view 56 of the emitting/detecting head 52 as described above. As those skilled in the art will readily recognize and appreciate, the fields of view 60 of the IRRCs 42 should overlap to a degree so as to prevent detecting "dead zones" within the field of view 56 of the emitting/detecting head 52. Any excessive overlap, on the other hand can represent wasted energy detection capability.

As shown in FIG. 9, the LEDs 54 and the photodetecting dies 46 are electrically connected to the associated electronics 62. The LEDs 54 are driven in parallel by a common signal from the electronics 62. The photodetecting dies 46 on the other hand are separately wired to the electronics 62 which preferably implements the techniques described in detail in a copending application Ser. No. 639,591, filed Jan. 9, 1991 by Poulin et al. entitled SWITCHED DIVERSITY FOR OPTICAL COMMUNICATIONS which is also assigned to the common assignee of this application. Under that approach, the electronics 62 only output one input signal to the communications electronics and logic of the base station (which can be part of electronics 62 or separate) as a function of which signal from the multiple photodetecting dies 46 is the best, i.e. producing the best signal-to-noise ratio with respect to the communications signal of interest. If multiple emitting/detecting heads 52 are used to cover a larger area, each emitting/detecting head 52 outputs a single "best" signal and the best signals from the various emitting/detecting heads 52 are again combined into an overall best signal which is then used as the input signal to the communications electronics and logic of the base station.

For commercial implementations of emitting/detecting heads 52 as described herein, the IRRCs 42 can be pre-molded of plastic (as mentioned earlier herein) in several specific shapes for several different installation positions. Several examples will now be shown and described. A curved band of IRRCs 42 lying in a common plane in the manner of FIG. 9 will produce a field of view that is partial-annular in shape. An emitting/detecting head 52 as in FIG. 9 placed on a wall at about eight to ten feet off the floor and angled downward will provide reasonably good coverage in an interior installation such as a waiting room, lobby, restaurant, or the like. There may, however, be certain dead zones such as directly under the head 52. In an outside installation where use distances may be greater and sunlight is more prevalent, such a configuration may not be as desirable.

In general, an overhead installation of one or more emitting/detecting heads 52 operating as part of the base station will provide the optimum results. This is because there is less chance of signal "shadowing" by the user or others in the area. IR communications is, of course, line-of-sight; so, anything which blocks the path of the IR link between the handset and the base station comprises a signal shadow. The more paths there are for the IR beams comprising the IR link signal, the less the possibility of signal shadowing. Thus, an overhead or ceiling installation is highly desirable. If placed in the center of the ceiling of a standard-sized room, it is also more likely that one emitting/detecting head 52 will be able to service the area while wall-mounting may require multiple emitting/detecting heads 52 to avoid dead zones. A unitary IRRC shell for implementing an emitting/detecting head 52 for center ceiling-mounting is shown in FIGS. 10 and 11 where it is generally labelled as 64. The IRRCs 42 are molded directly into the plastic of the shell 64. As can be seen from the drawings of FIGS. 10 and 11, the IRRCs 42 are constructed in pairs with one IRRC 42 of each pair having an LED die 54' at the focal plane 58 of one and a photodetecting die 46 at the focal plane 58 of the other. It will also be readily apparent from the drawing figures that those IRRCs 42 which will be directly under the shell 64 when it is mounted on the ceiling 12 (as best seen in FIG. 11) have a wider inlet opening 50 and are fewer in number than those closer to the ceiling 12 which service handsets at a greater distance. In this regard, the IRRCs 42 can potentially provide three functions. They focus their field of view at a particular area, they provide gain so as to improve the signal-to-noise ratio, and they shield against outside light so as to also improve the signal-to-noise ratio. With respect to incoming signals, the gain is generally a function of the area of the inlet opening 50 as compared to the area of the focal plane 58 upon which the light impinges.

Unitary shells for use on a wall at a mid location and on a wall at a corner are shown in FIGS. 12 and 13 where they are labelled as 64' and 64", respectively. Each would be a quarter of a circle in cross section in the plane XVI—XVI as depicted in FIG. 14. In other words, half of the cross section of FIG. 11. A typical emitter/detector arrangement for the shell 64' of FIG. 12 and typical results produced thereby are depicted in FIGS. 15-17. In FIG. 15, the IRRCs 42 containing IR emitters are labelled "E" while the IRRCs 42 containing IR detectors are labelled "D". Each pair of IRRCs 42 of like size is focused on a common field of view. As depicted in FIG. 16, the fields of view become smaller further from the wall-mounted shell 64'. This, of course, means that the gain is greater (as desired and necessary) and that more emitter/detector field of view pairs are needed to cover an area. As depicted in FIG. 17, the various fields of view 60 overlap to a great degree when generally frusto-conical IRRCs 42 are employed which produce a circular field of view 60.

As depicted in FIGS. 18-21, individual IRRCs 42 can be modified to produce non-circular fields of view and thereby produce a more efficient overall field of view 56 for an emitting/detecting head 52 incorporating them. The preferred IRRC field of view 60 is generally rectangular which is achieved with a shape which modifies in cross-section from bottom (adjacent the die 46, 54') to top (at the inlet opening 50) as depicted in FIG. 19. The cross-sectional shape modification required to produce an elliptical field of view 60 is depicted in FIG. 20. Note that it is preferred in each case that the cross sectional shape of the IRRC 42 at the focal plane 58 of the die 46, 54' be substantially square/rectangular, as appropriate, as the dies used for IR emitters and photodetectors are generally square or rectangular in shape. Thus, if a square die is placed in a circular focal pattern, the difference in area represents signal loss and, therefore, lost gain. The size of the focal plane 58 should also be about the same as that of the die 46, 54'. As can be seen from FIGS. 19 and 20, the cross sectional shape of the IRRC 42 smoothly changes from its shape at the focal plane 58 of the die 46, 54' to its shape at the inlet opening 50. In the case of the LED dies 54', of course, the "inlet" is actually an "outlet".

Finally, as depicted in FIG. 22, rather than employing standard unitary shells such as 64, 64', 64" containing multiple IRRCs 42, one might wish to have a more custom-configurable structure for emitting/detecting heads 52. In this case, a support structure 66 for mounting to the ceiling or wall is provided. The electronics 62 are contained within the support structure 66 and the support structure 66 can be of any shape such as those described earlier herein for emitting/detecting heads 52 (arcuate band, circular dome, semicircular dome, quarter-circular dome). The support structure 66 is provided with a plurality of faces 68 each having electrical connector sockets 70 therein which are connected to the electronics 62 by connecting wires 72. The IRRCs 42 are incorporated into individual emitting and detecting assemblies 74 having an LED die 54 or photodetector die 46 (as appropriate) mounted in the bottom and connected to connector prongs 76 adapted to electrically mate with the connector sockets 70 of the faces 68. The individual emitting and detecting assemblies 74 can be provided in various gains, focal directions, focal shapes, etc. In that way, when installing an emitting/detecting head 52 in a particular installation, the appropriate emitting and detecting assemblies 74 can be plugged into the faces 68 to best suit the characteristics of the particular environment.

While the major thrust of the foregoing has been directed to improving the operating characteristics of the base station in an IR-linked communications system and, in particular, an IR-linked public access telephone system wherein the base station is a telepoint connected to telephone lines and the user employs a handset, those skilled in the art will also recognize and appreciate that the IRRCs disclosed hereinbefore can also be employed to increase the range and improve the signal-to-noise ratio at the user's end when a directional IR link is employed and telephonic equipment is plugged into the IR link as disclosed in the above-referenced U.S. Pat. No. 4,867,046.

Wherefore, having thus described the present invention, what is claimed is:

1. In an infrared (IR) linked communications system having base stations and handsets each having an emitter emitting IR communications signals and a photodetector detecting IR communications signals and producing electrical signals therefrom, the improvement for reducing the cost to manufacture and power requirements of the handsets comprising:

a) each base station employing an emitter emitting strong IR communications signals into a field of view of the base station whereby said strong IR communications signals are easily detected by a low-cost photodetector in the handsets; and, b) each base station including a tubular IR reflective concentrator having an inlet end, an outlet end which is smaller than said inlet end, a focal plane located adjacent said outlet end, and a reflective inner surface disposed between said inlet end and said focal plane and reflecting substantially all IR light beams entering said inlet end from said field of view of the base station onto said focal plane, said tubular IR reflective concentrator having the photodetector disposed adjacent said focal plane with an active sensing surface of the photodetector disposed in said focal plane so that IR communications signals entering said inlet end are reflected onto said active sensing surface of the IR photodetector whereby there is a gain in strength of the IR communications signals, there is an improvement in the signal-to-noise ratio, and the handsets can employ low-power emitters.

2. The improvement to an infrared (IR) linked communications system of claim 1 wherein each base station additionally comprises:

a) a plurality of emitters aimed to direct IR communications signals into different portions of said field of view of the base station;

b) a plurality of photodetectors; and, c) a plurality of said tubular IR reflective concentrators associated with respective ones of said plurality of photodetectors and aimed to receive IR communications signals from different portions of said field of view of the base station.

3. The improvement to an infrared (IR) linked communications system of claim 2 wherein:

each of said plurality of tubular IR reflective concentrators has a circular cross section at all points between said outlet end and said inlet end.

4. The improvement to an infrared (IR) linked communications system of claim 2 wherein:

a) said active sensing surface of the photodetectors is rectangular in shape; and, b) each of said plurality of tubular IR reflective concentrators has a generally rectangular cross section at said focal plane.

5. The improvement to an infrared (IR) linked communications system of claim 4 wherein:

said active sensing surface of the photodetector and the cross section of each of said plurality of tubular IR reflective concentrators at said focal plane are substantially the same size and shape.

6. The improvement to an infrared (IR) linked communications system of claim 4 wherein:

each of said plurality of tubular IR reflective concentrators has a generally rectangular cross section at all points between said focal plane and said inlet end.

7. The improvement to an infrared (IR) linked communications system of claim 4 wherein:

each of said plurality of tubular IR reflective concentrators has a non-rectangular cross section at said inlet end and smoothly changes its cross sectional shape between said focal point and said inlet end.

8. The improvement to an infrared (IR) linked communications system of claim 2 wherein:

each of said plurality of tubular IR reflective concentrators has the photodetector mounted therein adjacent said outlet end with said active sensing surface in said focal plane.

9. The improvement to an infrared (IR) linked communications system of claim 8 and additionally comprising:

plug means electrically connected to the IR photodetector for removably plugging said tubular IR reflective concentrator and the IR photodetector in combination into a socket at the one location of the communications system provided therefor.

10. The improvement to an infrared (IR) linked communications system of claim 2 and additionally comprising:

a plurality of second tubular IR reflective concentrators associated with respective ones of said plurality of emitters and having an outlet end, an inlet end which is smaller than said outlet end, a focal plane located adjacent said inlet end, and a reflective inner surface disposed between said outlet end and said focal plane and reflecting substantially all IR light beams originating at said focal plane towards and into said outlet end, each of said plurality of tubular IR reflective concentrators having its associated emitter disposed adjacent said focal plane with an active emitting surface of the emitter disposed in said focal plane whereby IR light beams from the emitter are focused towards and onto a field of view having a size and shape related to the size and shape of said outlet end.

11. The improvement to an infrared (IR) linked communications system of claim 2 and additionally comprising:

light shield means carried by at least one of said plurality of tubular IR reflective concentrators adjacent said inlet end for blocking light beams from outside a desired field of view from entering said inlet end.

12. The improvement to an infrared (IR) linked communications system of claim 11 wherein:

said light shield means has a dark matte surface facing said inlet end for absorbing light beams from outside said desired field of view.

13. A base station for use in an infrared (IR) linked communications system having base stations and handsets each having an emitter emitting IR communications signals and a photodetector detecting IR communications signals and producing electrical signals therefrom comprising:

a) a plurality of emitters aimed to direct IR communications signals into different portions of a field of view of the base station;

b) a plurality of photodetectors; and, c) a plurality of first tubular IR reflective concentrators associated with respective ones of said plurality of photodetectors and aimed to receive IR communications signals from different portions of said field of view of the base station, wherein c1) each first tubular IR reflective concentrator has an inlet end, an outlet end which is smaller than said inlet end, a focal plane located adjacent said outlet end, and a reflective inner surface disposed between said inlet end and said focal plane and reflecting substantially all IR light beams entering said inlet end from an associated portion of said field of view of the base station onto said focal plane, and c2) each first tubular IR reflective concentrator has the photodetector disposed adjacent said focal plane with an active sensing surface of the photodetector disposed in said focal plane so that IR communications signals entering said inlet end are reflected onto said active sensing surface of the IR photodetector whereby there is a gain in strength of the IR communications signals, there is an improvement in the signal-to-noise ratio, and the handsets can employ low-power emitters.

14. The base station for use in an infrared (IR) linked communications system of claim 13 and additionally comprising:

a) a plurality of second tubular IR reflective concentrators associated with respective ones of said plurality of emitter; wherein, b) each second tubular IR reflective concentrator has an outlet end, an inlet end which is smaller than said outlet end, a focal plane located adjacent said inlet end, and a reflective inner surface disposed between said outlet end and said focal plane and reflecting substantially all IR light beams originating at said focal plane towards and into said outlet end;

c) each second tubular IR reflective concentrator has its associated emitter disposed adjacent said focal plane with an active emitting surface of the emitter disposed in said focal plane; and, d) each second tubular IR reflective concentrator is aimed at a different portion of said field of view of the base station whereby IR light beams from the emitter are focused towards and onto said portion and said portion has a size and shape related to the size and shape of said outlet end.

15. The base station for use in an infrared (IR) linked communications system of claim 14 wherein:

respective ones of said plurality of first tubular IR reflective concentrators and said plurality of second tubular IR reflective concentrators are aimed at common different portions of said field of view of the base station.

16. The base station for use in an infrared (IR) linked communications system of claim 14 wherein:

said plurality of first tubular IR reflective concentrators and said plurality of second tubular IR reflective concentrators are contained in a unitary shell structure.

17. The base station for use in an infrared (IR) linked communications system of claim 14 wherein:

a) ones of said plurality of first tubular IR reflective concentrators aimed at fields of view adjacent to the base station have inlet openings with larger areas than ones of said plurality of first tubular IR reflective concentrators aimed at fields of view further from the base station; and, b) ones of said plurality of second tubular IR reflective concentrators aimed at fields of view adjacent to the base station have outlet openings with larger areas than ones of said plurality of second tubular IR reflective concentrators aimed at fields of view further from the base station.

18. The base station for use in an infrared (IR) linked communications system of claim 14 and additionally comprising:

a) a support structure having a plurality of faces each having an electrical connector socket with connecting wires connected thereto for connecting said connector socket to electronics associated with the base station; wherein additionally, b) said plurality of first tubular IR reflective concentrators has the photodetector mounted therein adjacent said outlet end with said active sensing surface in said focal plane;

c) said plurality of second tubular IR reflective concentrators has the emitters therein adjacent said inlet end with said active emitting surface in said focal plane; and additionally comprising, d) plug means electrically connected to respect ones of the photodetectors and the emitters for removably plugging said first tubular IR reflective concentrators and their associated photodetectors in combination and said second tubular IR reflective concentrators and their associated emitters in combination into said socket of selected respective ones of said faces whereby to customize the photodetector and emitter arrangement and aiming of the base station.

19. The base station for use in an infrared (IR) linked communications system of claim 14 wherein:

each of said plurality of first tubular IR reflective concentrators and said plurality of second tubular IR reflective concentrators has a circular cross section at all points between said outlet end and said inlet end.

20. The base station for use in an infrared (IR) linked communications system of claim 14 wherein:

a) said active sensing surface of the photodetectors is rectangular in shape;

b) said active emitting surface of the emitters is rectangular in shape; and c) each of said plurality of first tubular IR reflective concentrators and said plurality of second tubular IR reflective concentrators has a generally rectangular cross section at said focal plane.

21. The base station for use in an infrared (IR) linked communications system of claim 20 wherein:

a) said active sensing surface of the associated photodetector and the cross section of each of said plurality of first tubular IR reflective concentrators at said focal plane are substantially the same size and shape; and, b) said active emitting surface of the associated emitter and the cross section of each of said plurality of second tubular IR reflective concentrators at said focal plane are substantially the same size and shape.

22. The base station for use in an infrared (IR) linked communications system of claim 20 wherein:

a) each of said plurality of first tubular IR reflective concentrators has a generally rectangular cross section at all points between said focal plane and said inlet end; and, b) each of said plurality of second tubular IR reflective concentrators has a generally rectangular cross section at all points between said focal plane and said outlet end.

* * * * *